United States Patent
Shea

(10) Patent No.: US 10,153,167 B2
(45) Date of Patent: Dec. 11, 2018

(54) SEMICONDUCTOR DEVICES WITH CAVITIES

(71) Applicant: Great Wall Semiconductor Corporation, Milpitas, CA (US)

(72) Inventor: Patrick M. Shea, Oviedo, FL (US)

(73) Assignee: Great Wall Semiconductor Corporation, Milpitas, CA (US)

( * ) Notice: Subject to any disclaimer, the term of this patent is extended or adjusted under 35 U.S.C. 154(b) by 0 days.

(21) Appl. No.: 15/601,905

(22) Filed: May 22, 2017

(65) Prior Publication Data
US 2017/0263737 A1     Sep. 14, 2017

Related U.S. Application Data

(63) Continuation of application No. 14/966,783, filed on Dec. 11, 2015, now Pat. No. 9,666,703.
(Continued)

(51) Int. Cl.
| | |
|---|---|
| *H01L 21/18* | (2006.01) |
| *H01L 29/06* | (2006.01) |
| *H01L 21/02* | (2006.01) |
| *H01L 29/66* | (2006.01) |
| *H01L 23/544* | (2006.01) |
| *H01L 29/78* | (2006.01) |
| *H01L 21/8234* | (2006.01) |
| *H01L 29/739* | (2006.01) |
| *H01L 21/20* | (2006.01) |

(Continued)

(52) U.S. Cl.
CPC ...... *H01L 21/187* (2013.01); *H01L 21/02035* (2013.01); *H01L 21/185* (2013.01); *H01L 21/2007* (2013.01); *H01L 21/7624* (2013.01); *H01L 21/823418* (2013.01); *H01L 21/823481* (2013.01); *H01L 23/544* (2013.01); *H01L 29/0634* (2013.01); *H01L 29/0661* (2013.01); *H01L 29/0696* (2013.01); *H01L 29/66681* (2013.01); *H01L 29/7395* (2013.01); *H01L 29/7396* (2013.01); *H01L 29/7816* (2013.01); *H01L 33/0079* (2013.01); *H01L 2223/54426* (2013.01); *H01L 2223/54453* (2013.01); *H01L 2924/0002* (2013.01)

(58) Field of Classification Search
CPC . H01L 21/185; H01L 21/187; H01L 21/2007; H01L 21/7624; H01L 21/76275; H01L 33/0079; H01L 27/12; H01L 27/1203; H01L 27/1207
See application file for complete search history.

(56) References Cited

U.S. PATENT DOCUMENTS

| | | |
|---|---|---|
| 4,601,096 A | 7/1986 | Calviello |
| 4,710,794 A | 12/1987 | Koshino et al. |
| | (Continued) | |

OTHER PUBLICATIONS

Danny Weiss et al., "An Integrated Cavity Wafer Level Chip Size Package for MEMS Applications", Micromachining and Microfabrication Process Technology VII, Proceedings of SPIE vol. 4457 (2001), 183-191.

*Primary Examiner* — Eduardo A Rodela
(74) *Attorney, Agent, or Firm* — Foley & Lardner LLP

(57) ABSTRACT

A semiconductor device comprises a first semiconductor wafer including a cavity formed in the first semiconductor die. A second semiconductor die is bonded to the first semiconductor die over the cavity. A first transistor includes a portion of the first transistor formed over the cavity.

19 Claims, 11 Drawing Sheets

Related U.S. Application Data

(60) Provisional application No. 62/092,903, filed on Dec. 17, 2014.

(51) Int. Cl.
   *H01L 33/00* (2010.01)
   *H01L 21/762* (2006.01)

(56) References Cited

U.S. PATENT DOCUMENTS

| | | | |
|---|---|---|---|
| 5,949,144 A | 9/1999 | Delgado et al. | |
| 6,441,432 B1 | 8/2002 | Sumida | |
| 9,318,603 B2* | 4/2016 | Su | H01L 29/7827 |
| 2007/0035731 A1* | 2/2007 | Hulsmann | G03F 9/7038 |
| | | | 356/401 |
| 2007/0152269 A1* | 7/2007 | Haase | H01L 27/1203 |
| | | | 257/335 |
| 2012/0168856 A1* | 7/2012 | Luo | H01L 29/0634 |
| | | | 257/330 |
| 2013/0069694 A1* | 3/2013 | Saito | H03K 17/00 |
| | | | 327/109 |
| 2013/0122663 A1* | 5/2013 | Lu | H01L 29/66333 |
| | | | 438/138 |

\* cited by examiner

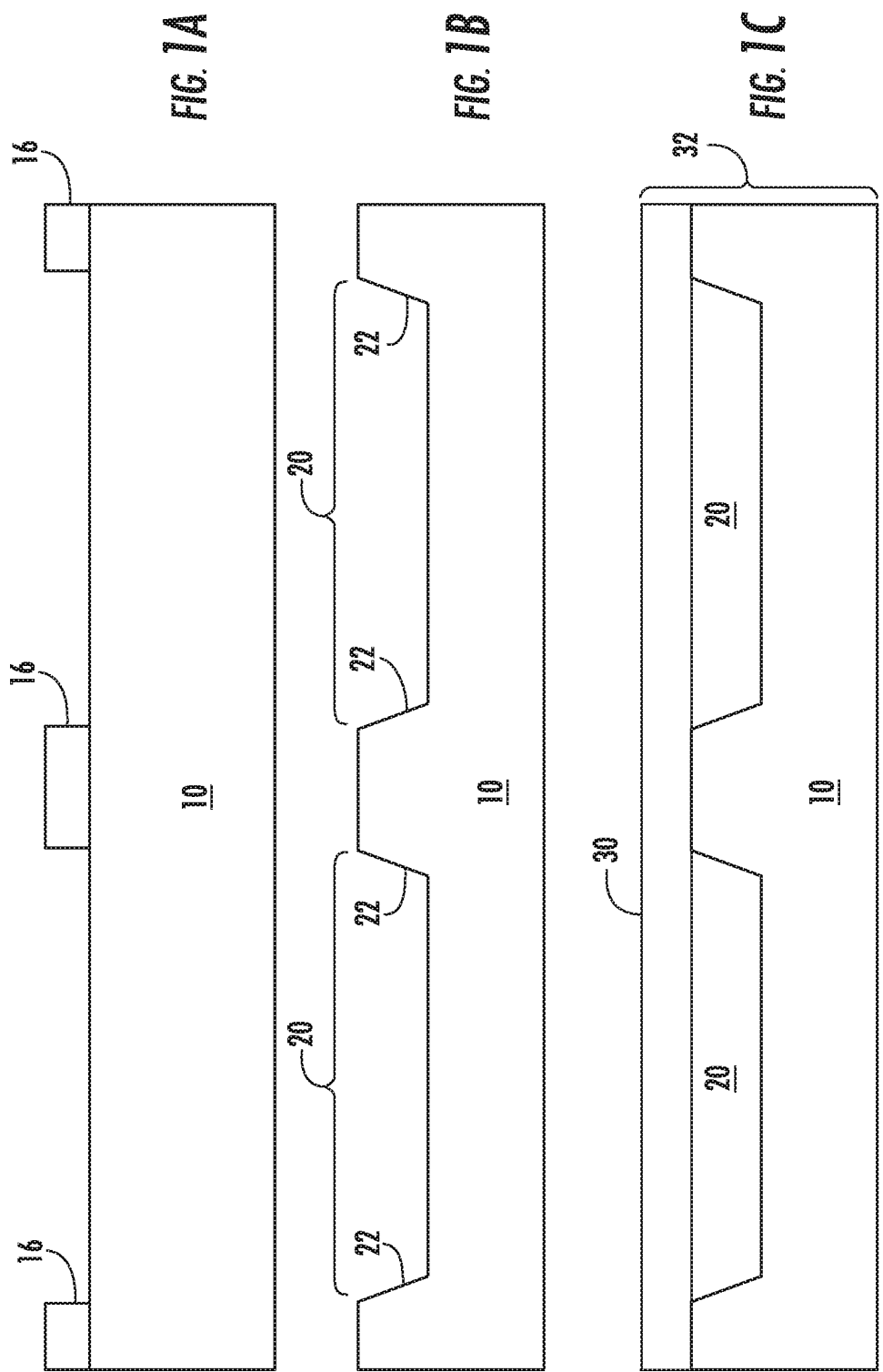

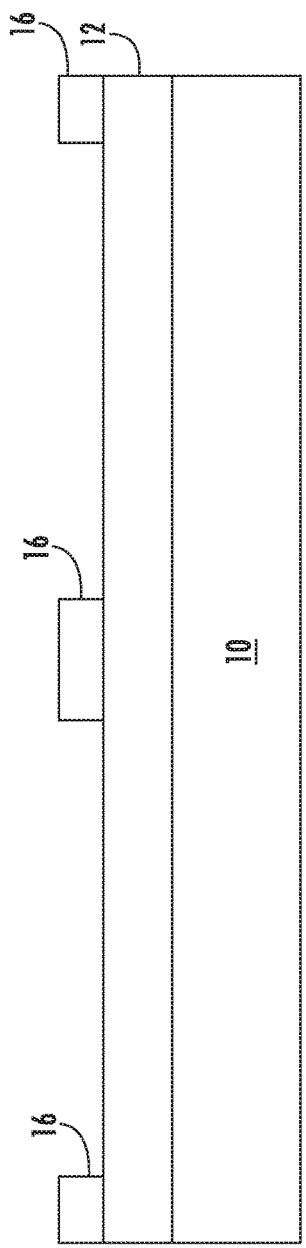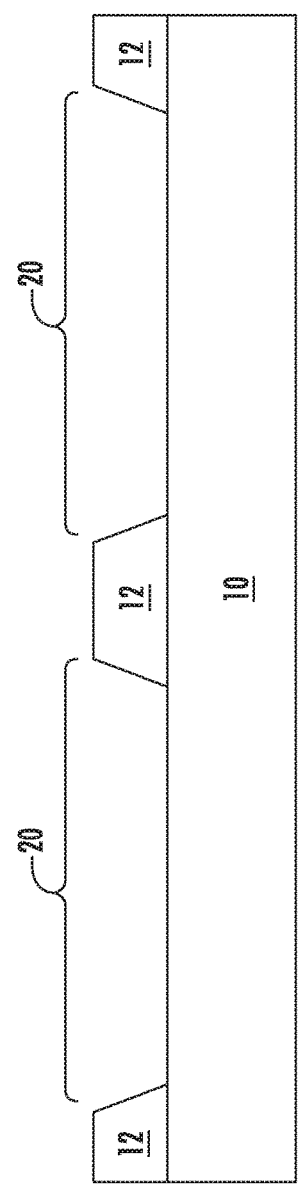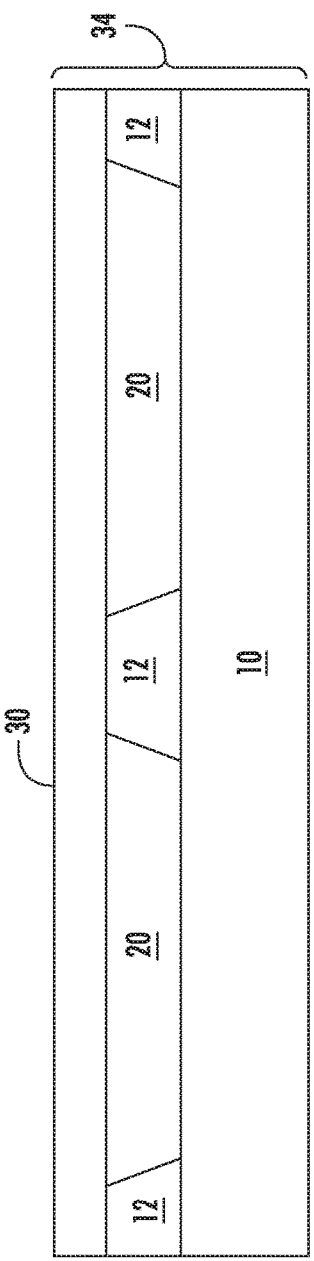

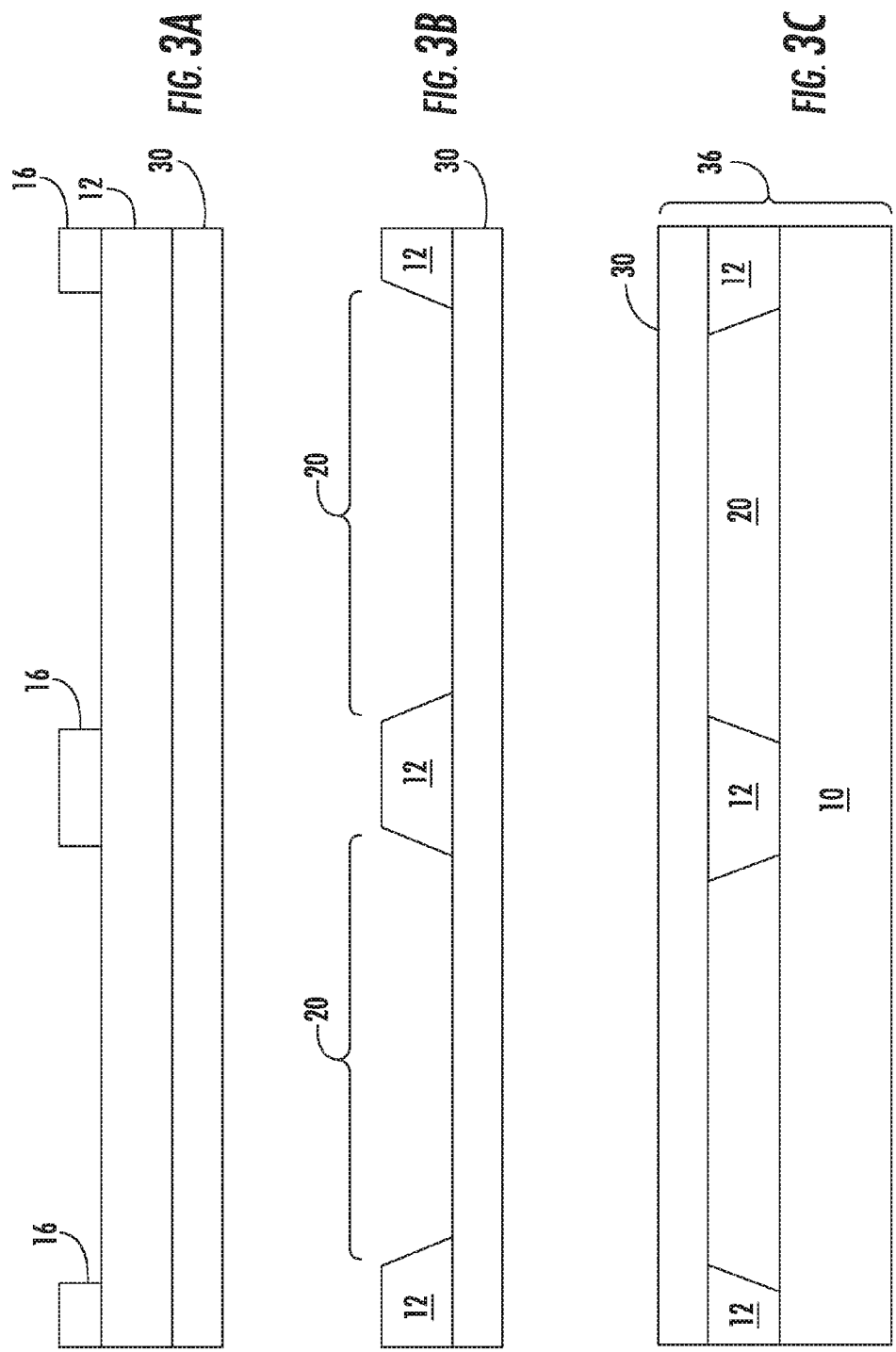

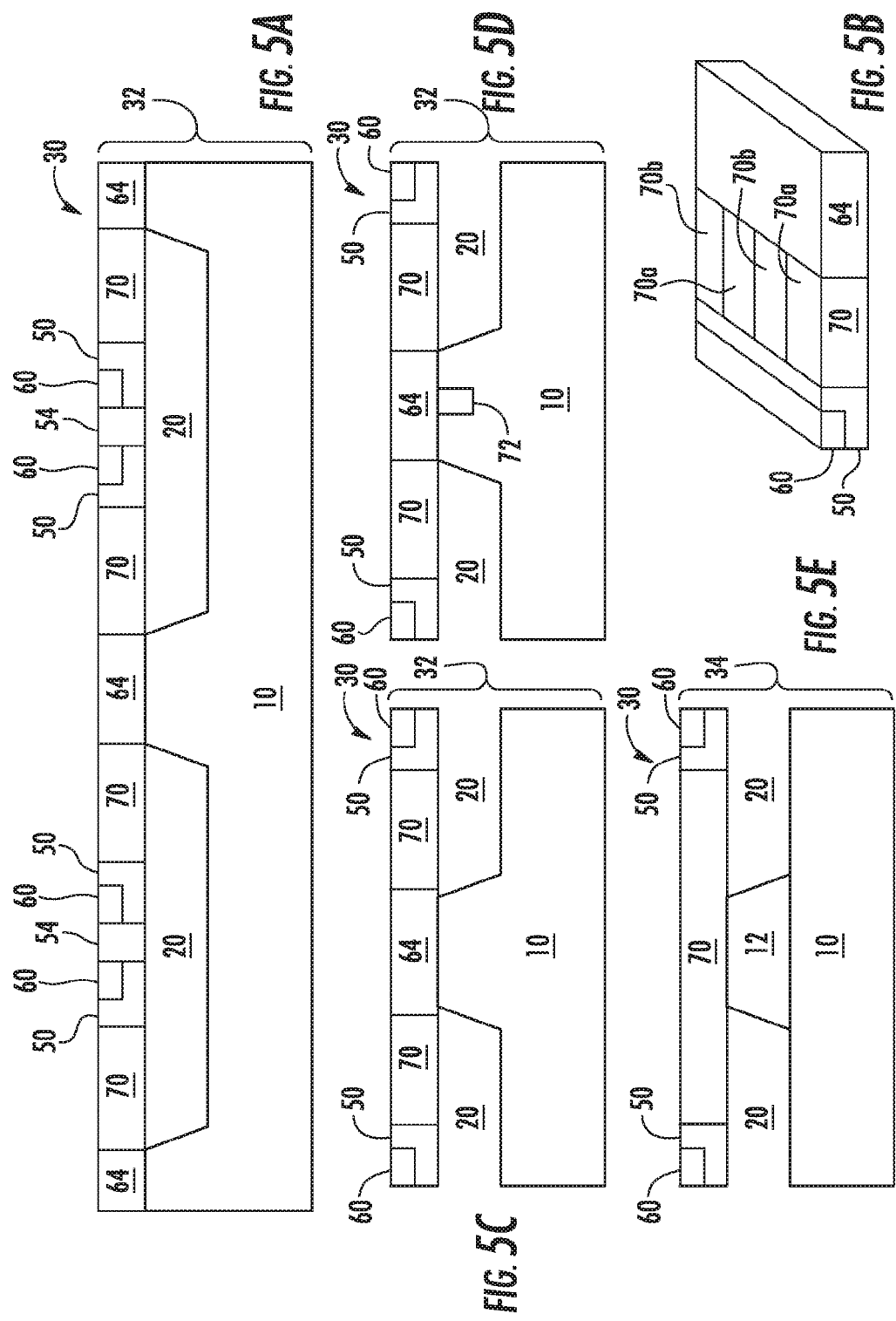

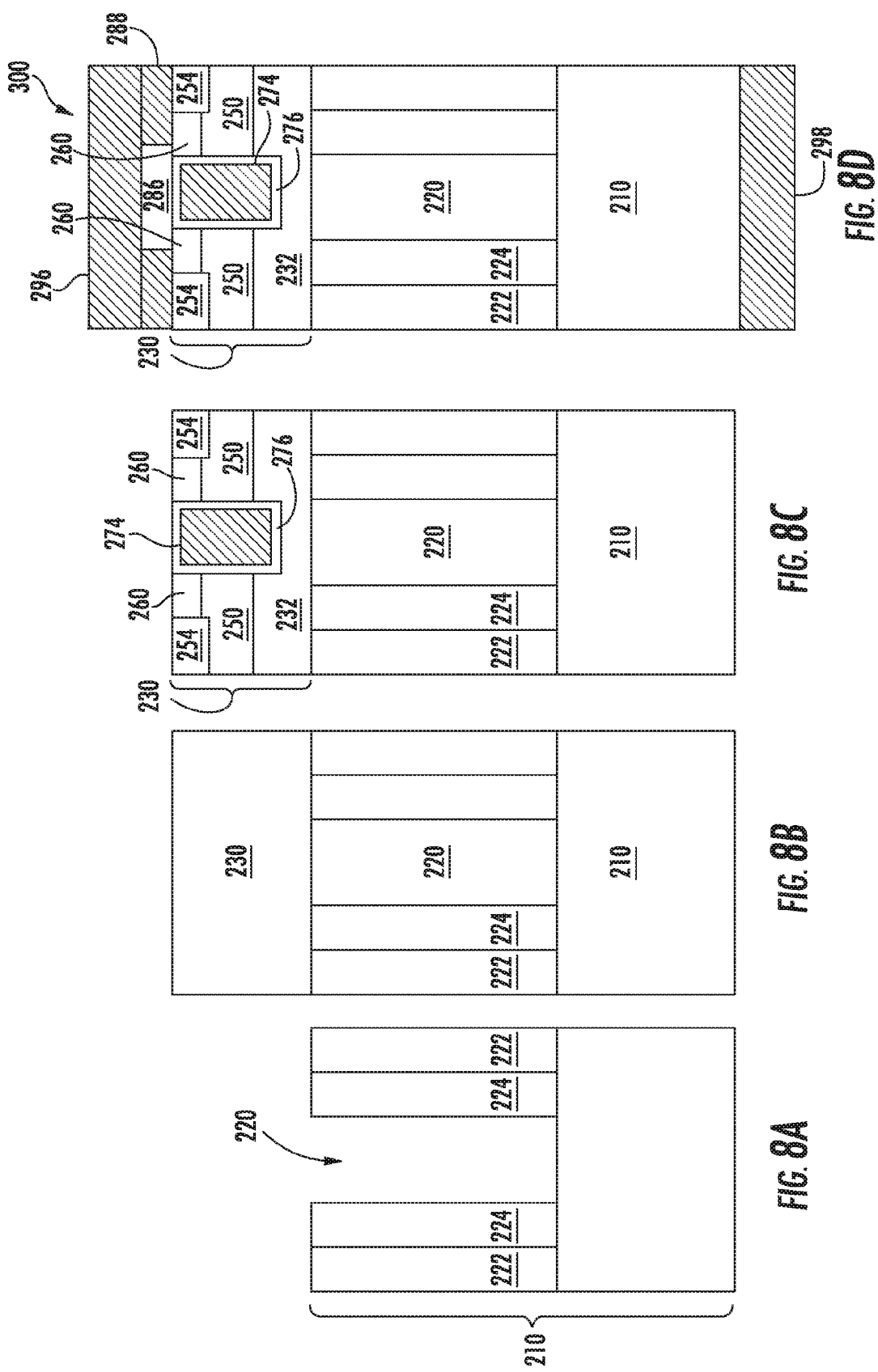

SEMICONDUCTOR DEVICES WITH CAVITIES

CROSS-REFERENCE TO RELATED APPLICATIONS

The present application is a continuation of U.S. patent application Ser. No. 14/966,783 filed Dec. 11, 2015, now U.S. Pat. No. 9,666,703, which application claims the benefit of U.S. Provisional Application No. 62/092,903, filed Dec. 17, 2014, the contents of all such applications being incorporated herein by reference in their entirety.

BACKGROUND

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal-oxide-semiconductor field-effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment. In particular, power MOSFETs are commonly used in electronic circuits, such as communication systems and power supplies, as electric switches to enable and disable the conduction of relatively large currents in, e.g., DC-to-DC voltage converters, power supplies, and motor controllers.

A power MOSFET device includes a large number of MOSFET cells or individual transistors that are connected in parallel and distributed across a surface of a semiconductor die. Power MOSFET devices are typically used as electronic switches to control power flow to a circuit. A control signal at a gate of the power MOSFET controls whether current flows through the MOSFET between a drain terminal and source terminal of the MOSFET. The conduction path between the drain terminal and source terminal of a MOSFET is wired in series with a circuit to be switched, so that when the MOSFET is off, i.e., the MOSFET limits electric current between the source and drain terminals, current is limited through the switched circuit. When the MOSFET is on, electric current flows through both the MOSFET and the switched circuit, in series, to power the switched circuit.

One specification of a power MOSFET is the MOSFET's parasitic capacitances. Parasitic capacitances are capacitances that exist between the conductive parts of an electronic component or device because of the proximity of the conductive elements to each other. Parasitic capacitance generally exists in a power MOSFET between the gate and source of the MOSFET, between the gate and drain, as well as between the drain and source. Parasitic capacitance becomes a more significant factor when a power MOSFET is operated at higher frequency.

SUMMARY

Accordingly, in one embodiment, the present invention is a method of making a semiconductor device comprising providing a first semiconductor wafer, forming a cavity in the first semiconductor wafer, bonding a second semiconductor wafer to the first semiconductor wafer over the cavity, and forming a transistor including a portion of the transistor over the cavity.

In another embodiment, the present invention is a method of making a semiconductor device comprising providing a first semiconductor die, forming a cavity in the first semiconductor die, bonding a second semiconductor die to the first semiconductor die over the cavity, and forming a transistor including a gate of the transistor formed over the cavity.

In another embodiment, the present invention is a semiconductor device comprising a first semiconductor die including a cavity formed in the first semiconductor die. A second semiconductor die is bonded to the first semiconductor die over the cavity. A first transistor includes a portion of the first transistor formed over the cavity.

BRIEF DESCRIPTION OF THE DRAWINGS

FIGS. 1a-1c illustrate formation of a cavity wafer;

FIGS. 2a-2c illustrate formation of a cavity wafer in an alternative embodiment;

FIGS. 3a-3c illustrate formation of a cavity wafer in another alternative embodiment;

FIGS. 5a-5e illustrate doping of a device wafer and alignment of the doping regions to the cavity;

FIGS. 8a-8d illustrate forming a vertical trench MOSFET with a cavity wafer.

DETAILED DESCRIPTION

Figure 4A:
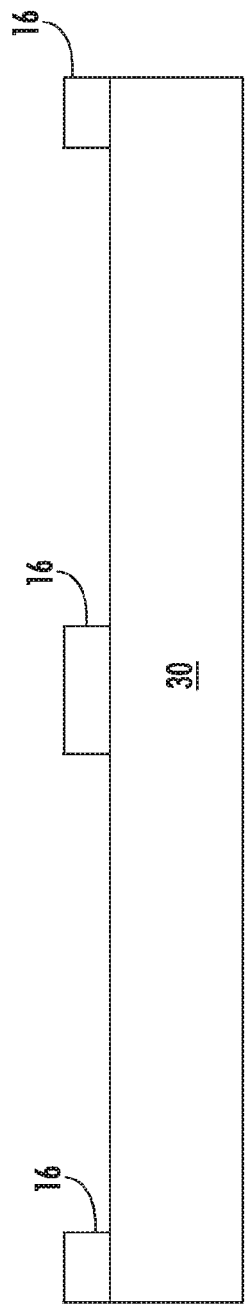
FIGS. 4a-4c illustrate formation of a cavity wafer in a third alternative embodiment.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

A region of a semiconductor wafer can be negatively doped or positively doped. Negatively doped, or N-doped, regions are doped with a negative, or N-type, dopant, such as phosphorus, antimony, or arsenic. Each molecule of an N-type dopant contributes an additional negative charge carrier, i.e., an electron, to the semiconductor wafer. Positively doped, or P-doped, regions are doped with a positive, or P-type, dopant such as boron, aluminum, or gallium. Each molecule of P-type dopant contributes an additional positive charge carrier, i.e., an electron hole, to the semiconductor wafer. A region of one doping type can be made into a region of the other doping type by adding dopant of the second type in excess of the existing doping concentration. N-type and P-type regions are oppositely doped.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribe lines. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is integrated into the system.

FIG. 1a shows a cross-sectional view of a portion of handle wafer 10. Handle wafer 10 is a semiconductor wafer formed from a base substrate material, such as silicon, germanium, aluminum phosphide, aluminum arsenide, gallium arsenide, gallium nitride, indium phosphide, silicon carbide, or other bulk semiconductor material. In one embodiment, handle wafer 10 has a width or diameter of 200-300 millimeters (mm). In another embodiment, handle wafer 10 has a width or diameter of 100-450 mm.

Handle wafer 10 is doped with an N-type dopant, such as phosphorus, antimony, or arsenic, to form an N+ doped substrate. N+ doping indicates a relatively strong concentration of N-type dopants in handle wafer 10. Dopants are added while growing the semiconductor boule that handle wafer 10 is cut from, to provide an approximately uniform initial doping throughout the wafer. In other embodiments, handle wafer 10 is doped to an N+ substrate using diffusion, ion implantation, or other suitable processes. Handle wafer 10 becomes the drain contact of a subsequently formed MOSFET. Handle wafer 10 is negatively doped because handle wafer 10 is coupled to the drain of an N-channel MOSFET device. If a P-channel device is being formed, handle wafer 10 is doped with a P-type dopant. In one embodiment, handle wafer 10 is disposed over a temporary or sacrificial carrier for processing.

A portion of handle wafer 10 is removed by an etching process that uses mask 16, which is a photoresist layer in some embodiments, to form cavities 20. Mask 16 protects portions of handle wafer 10 while an etching process removes material of the wafer not covered by mask 16. Various wet and dry etching techniques are usable to form cavities 20. In one embodiment, reactive-ion etching is used to form cavities 20. Cavities 20 are formed as the etching process removes base substrate material of handle wafer 10 outside of the footprint of mask 16.

Cavities 20 include sidewalls 22. Sidewalls 22 are illustrated as sloping away from cavities 20, but include other slopes, and shapes other than linear, in other embodiments. The slope and shape is partially determined by the isotropy of the particular etching method used. Sidewalls 22 slope into cavity 20, out of cavity 20, or are perpendicular to surfaces of handle wafer 10 in various embodiments. In other embodiments, sidewalls 22 are linear, rounded, or include other shapes.

Cavities 20 are shaped as stripes extending into and out of FIG. 1b. Cavities 20 extend across handle wafer 10 in a direction perpendicular to the page of FIG. 1b because the eventually formed MOSFETs are formed as stripes over handle wafer 10. However, in other embodiments, where MOSFETs are formed in other shapes and patterns, cavities 20 are shaped as needed to provide for cavity 20 to extend under subsequently formed gates of the MOSFET. In one embodiment, cavities 20 are formed broken into discrete line segments across handle wafer 10 or device wafer 30 rather than uninterrupted stripes. The depth of cavity 20 into handle wafer 10 is between one and ten micrometers (μm) and the width of cavity 20 is approximately twice the length of a subsequently formed drift region in some embodiments. As drift length scales with breakdown voltage (BVdss), a BVdss of 600 volts results in a width of cavity 20 between approximately 60 μm and 100 μm. Lower voltage devices may utilize a thinner and shallower cavity 20.

After etching of cavity 20 is complete, handle wafer 10 is cleaned using chemical-mechanical polishing (CMP), mechanical planarization, or other suitable methods, to remove remaining portions of mask 16. The result of the cleaning process is handle wafer 10, which is N+ doped and includes cavities 20 as illustrated in FIG. 1b.

After cavities 20 are formed in handle wafer 10, and handle wafer 10 is polished, a device wafer 30 is disposed over handle wafer 10. Device wafer 30 is an undoped or lightly doped wafer of semiconductor material. Device wafer 30 is bonded to handle wafer 10 using direct wafer-to-wafer bonding. Handle wafer 10 and device wafer 30 are annealed at elevated temperatures so that the lattice structures of the semiconductor atoms combine. In the case of handle wafer 10 and device wafer 30 being formed of Si, covalent Si—Si bonds are established between opposing surfaces of handle wafer 10 and device wafer 30.

Handle wafer 10 bonded to device wafer 30 with cavities 20 between handle wafer 10 and device wafer 30 constitutes a cavity wafer 32. In one embodiment, device wafer 30 is provided as a wafer having substantially the same diameter and thickness as handle wafer 10. Device wafer 30 is thinned using a backgrinding or polishing process after bonding to reduce a thickness of device wafer 30. The thickness of device wafer 30 is reduced to a desired thickness for forming the various doped regions of a MOSFET.

FIGS. 2a-2c illustrate an alternative embodiment of forming a cavity wafer 34. An epitaxial layer 12 is grown on handle wafer 10. Epitaxial layer 12 includes an N-type doping with a lower concentration of dopants than in handle wafer 10. Epitaxial layer 12 is doped by adding impurities during the formation of epitaxial layer 12. Mask 16 is used to form cavities 20 in epitaxial layer 12, as shown in FIG. 2b.

Remaining portions of mask 16 are removed, leaving cavities 20 extending perpendicular to the page as stripes across handle wafer 10. Portions of epitaxial layer 12 remain around cavities 20. In some embodiments, a portion of epitaxial layer 12 remains at the bottom of cavities 20. In other embodiments, cavities 20 extend into handle wafer 10. In FIG. 2c, device wafer 30 is bonded to epitaxial layer 12 over handle wafer 10 and cavities 20 to form cavity wafer 34. In some embodiments, device wafer 30 is thinned to a desired thickness after device wafer 30 is bonded to epitaxial layer 12. Cavity wafer 34 in FIG. 2c is similar to cavity wafer 32 in FIG. 1c, except that cavity wafer 34 includes epitaxial layer 12. Epitaxial layer 12 provides a relatively lightly doped region between handle wafer 10 and device wafer 30.

Use of epitaxial layer 12 increases the thermal budget of the bonding process between handle wafer 10 and device wafer 30. During bonding, heat used causes dopants to spread from handle wafer 10 and into device wafer 30. Epitaxial layer 12 creates separation between handle wafer 10 and device wafer 30 to reduce the amount of dopants which are transferred into device wafer 30 during the anneal process.

FIGS. 3a-3c illustrate a third embodiment of forming a cavity wafer 36. In FIG. 3a, epitaxial layer 12 is grown on device wafer 30. Cavities 20 are etched into epitaxial layer 12 using mask 16 with epitaxial layer 12 on device wafer 30. After cavities 20 are formed in epitaxial layer 12, remaining portions of mask 16 are removed. FIG. 3b illustrates device wafer 30 and epitaxial layer 12, including cavities 20, after remaining portions of mask 16 are removed.

In FIG. 3c, handle wafer 10 is provided, on a temporary carrier in some embodiments, as a substrate. Device wafer 30 and epitaxial layer 12 are flipped and disposed over handle wafer 10. A thermal anneal is performed to bond epitaxial layer 12 to handle wafer 10. Device wafer 30 is bonded to handle wafer 10 via epitaxial layer 12 with cavities 20 disposed between handle wafer 10 and device wafer 30 to form cavity wafer 36. Cavity wafer 36 is similar to cavity wafer 34, with epitaxial layer 12 between handle wafer 10 and device wafer 30. However, epitaxial layer 12 was grown on device wafer 30 instead of handle wafer 10. Sidewalls 22 of cavities 20 are illustrated slopping in opposite directions between FIGS. 2c and 3c because of the growth of epitaxial layer 12 on the opposite wafer, but other cavity wafer embodiments could have cavity sidewalls of any appropriate slope in practice.

Figure 4B:
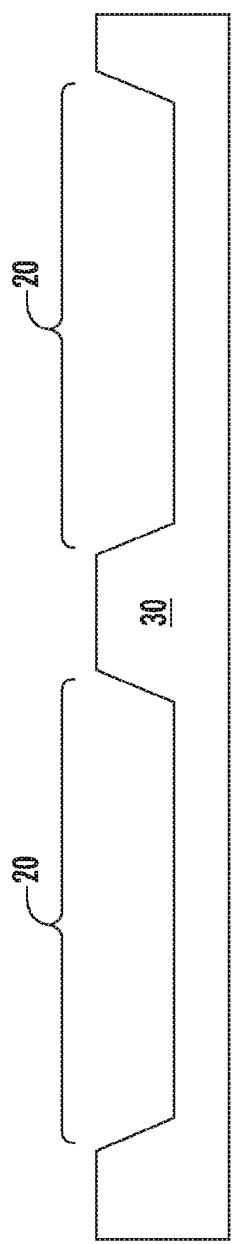
Figure 4C:
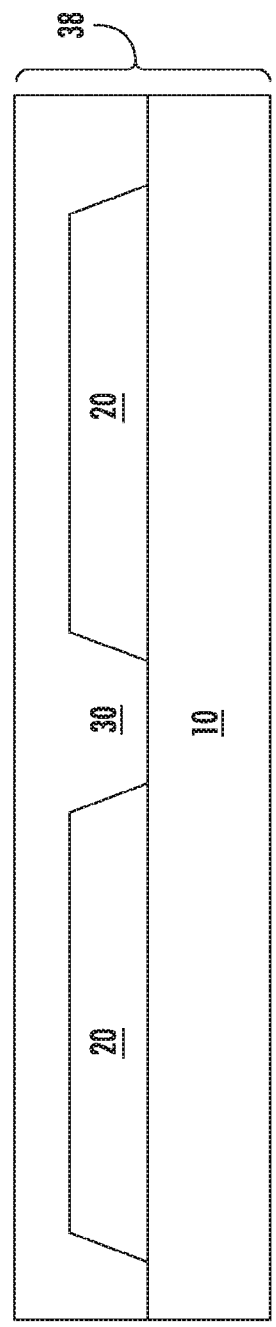

In a fourth embodiment of forming a cavity wafer, illustrated in FIGS. 4a-4c, cavities 20 are formed directly in device wafer 30 without the use of epitaxial layer 12. Device wafer 30 is provided as sufficiently thick to accommodate formation of cavities 20, followed by a thinning of device wafer 30 if needed. Device wafer 30 is bonded to handle wafer 10 after formation of cavities 20 in device wafer 30 to form cavity wafer 38, as illustrated in FIG. 4c.

FIG. 5a illustrates cavity wafer 32 with device wafer 30 doped for use in one MOSFET embodiment. Device wafer 30 includes P-channel region 50, P+ body contact 54, N+ source region 60, N+ drain region 64, and drift region 70. While an N-channel MOSFET is illustrated, a P-channel MOSFET is formed by doping each region with an opposite type of dopant. In addition, device wafer 30 is doped similarly in other cavity wafer embodiments to form a MOSFET device based on, e.g., cavity wafers 34, 36, or 38.

Each of the doped regions 50, 54, 60, 64, and 70 are formed using a corresponding photoresist mask, similar to mask 16. Doped regions 50, 54, 60, 64, and 70 each extend across cavity wafer 32 in parallel with cavities 20, e.g., as stripes into and out of the page as illustrated in FIG. 5b. A photoresist layer is formed over substantially the entire top surface of device wafer 30, and the photoresist layer is etched away over an area to be doped. For instance, to dope P+ body contact 54, an opening in the photoresist layer is formed over the desired location for P+ body contact 54. As dopants are implanted into device wafer 30 from above, the dopants are successfully implanted into device wafer 30 where openings in the photoresist layer are located. Where the photoresist layer remains, dopants are blocked by the photoresist layer from being implanted into device wafer 30 in significant quantities. In some embodiments, multiple implant steps are used for each doped area. Varying the energy of the dopant implantation results in depositing dopants to a varying depth in device wafer 30.

After doping of a first region in device wafer 30, the photoresist mask is removed, and another photoresist mask is applied to dope another region of device wafer 30. In some embodiments, a single mask is used to dope every region of device wafer 30 that is similarly doped in a single implantation step. The various regions of device wafer 30 are doped in any appropriate order. In one embodiment, device wafer 30 is provided initially to have a desired doping concentration of one of the final doped regions, and then a specific mask is not needed to dope the region in question.

P+ body contact 54 and N+ source region 60 are doped with a relatively high concentration in order to provide good ohmic contact to a metal layer, which will be subsequently formed over P+ body contact 54 and N+ source region 60. The contact between source metal layers and P-channel regions 50 provided by P+ body contact 54 biases a parasitic NPN BJT transistor formed by N+ source region 60, P-channel region 50, and drift region 70. The biasing of the parasitic NPN BJT transistor reduces the likelihood of latch-up occurring. Doping N+ source region 60 with a higher concentration of dopants reduces contact resistance and the overall resistance of current through the MOSFET device from drain to source. N+ source region 60 operates as the source of the MOSFET as well as providing good ohmic contact. N+ drain regions 64 are doped with a relatively high concentration to provide good electrical contact with handle wafer 10. N+ drain regions 64 are formed at least partially outside of a footprint of cavity 20 to contact handle wafer 10, or epitaxial layer 12 formed over handle wafer 10. Handle wafer 10 serves as the drain contact of the MOSFET cell.

Drift region 70 is doped with N-type dopant. Drift region 70 is typically doped relatively lightly to support a higher breakdown voltage from drain to source. Drift region 70 and N+ source region 60 are both doped with negative dopant, while P-channel region 50 is formed with positive dopant between N+ source region 60 and drift region 70. Because P-channel region 50 includes an opposite majority carrier than drift region 70 and P+ body contact 54, electric current does not normally flow through the MOSFET from drain to source. A gate subsequently formed over P-channel region 50, e.g. gate 74 in FIG. 5, is provided with a positive charge, which results in an electric field that attracts electrons, i.e., negative carriers, to the area of P-channel region 50 between drift region 70 and N+ source region 60. When a sufficient charge is applied to the gate, and enough electrons are gathered between N+ source region 60 and drift region 70, current flows from drain to source via drift region 70, P-channel region 50, and N+ source region 60.

In other embodiments, other types of drift regions are used. In one embodiment, drift region 70 is doped with a linear or other gradient to form a reduced surface field (RESURF) drift region. Forming drift region 70 as a RESURF drift region reduces the electric field at the junction between drift region 70 and P-channel region 50 by spreading out the electric field throughout drift region 70. Spreading out the electric field allows a higher doping concentration in drift region 70, which reduces the resistance of current through the MOSFET. In another embodiment, drift region 70 is a superjunction, as illustrated in FIG. 5b. Forming drift region 70 as a superjunction involves forming charge balanced N stripes 70a and P stripes 70b that deplete as the drain voltage is increased relative to the source voltage. Each of the N stripes 70a and P stripes 70b of drift region 70 extends from N+ drain region 64 to P-channel region 50. N stripes 70a and P stripes 70b of the superjunction of drift region 70 are formed using two separate masks in one embodiment.

Improvements in the precision of the alignment of doped regions 50, 54, 60, 64, and 70 relative to cavities 20 provides advantages in the operation of quasi-lateral MOSFET 100. FIG. 5a illustrates ideal alignment, where the width of contact between handle wafer 10 and device wafer 30 is exactly the same width as and exactly aligned over drain regions 64. In practice, the contact between handle wafer 10 and device wafer 30 will commonly be offset relative to N+ drain region 64. Cavities 20 are not easily visible through device wafer 30, so alignment is limited based on tolerances of dopant deposition and ability to accurately recall where cavities 20 are located within cavity wafer 32. FIGS. 5c-5e illustrate methods of improving alignment of the doping of device wafer 30 or handle wafer 10 relative to cavities 20.

In FIG. 5c, the width of N+ drain region 64 is increased to at least the sum of the distance between adjacent cavities 20 and any alignment tolerances involved. With a widened N+ drain region 64, the physical contact between handle wafer 10 and device wafer 30 occurs entirely within the footprint of N+ drain region 64 even at a maximum expected misalignment. Drift regions 70 remain entirely within a footprint of cavities 20.

FIG. 5d illustrates a fiducial marker 72 disposed in a top surface of handle wafer 10 outside of cavity 20. Device wafer 30 is thinned during the formation of cavity wafer 32. After thinning, device wafer 30 is transmissive to a limited amount of light. Some light is allowed to pass through device wafer 30, although directly observing cavities 20 through device wafer 30 is a challenge. Fiducial marker 72 provides significant optical contrast with handle wafer 10. Fiducial marker 72 is visible through device wafer 30, using the visible light spectrum or other frequencies of electromagnetic radiation, allowing accurate alignment of doping relative to cavities 20. Fiducial marker 72 is disposed within epitaxial layer 12 in embodiments that form cavity 20 in epitaxial layer 12.

In FIG. 5e, drift region 70 extends completely between two adjacent P-channel regions 50. Less precise alignment is acceptable in the embodiment of FIG. 5e because contact between handle wafer 10 and device wafer 30 occurs within drift region 70 even with a large misalignment. In some embodiments where physical contact is provided between drift region 70 and the area surrounding cavities 20, epitaxial layer 12 is used rather than direct physical contact between handle wafer 10 and device wafer 30. The lower dopant concentration of epitaxial layer 12 reduces the strength of electric fields near the surface of device wafer 30 to reduce the likelihood of avalanche breakdown.

Figure 6:
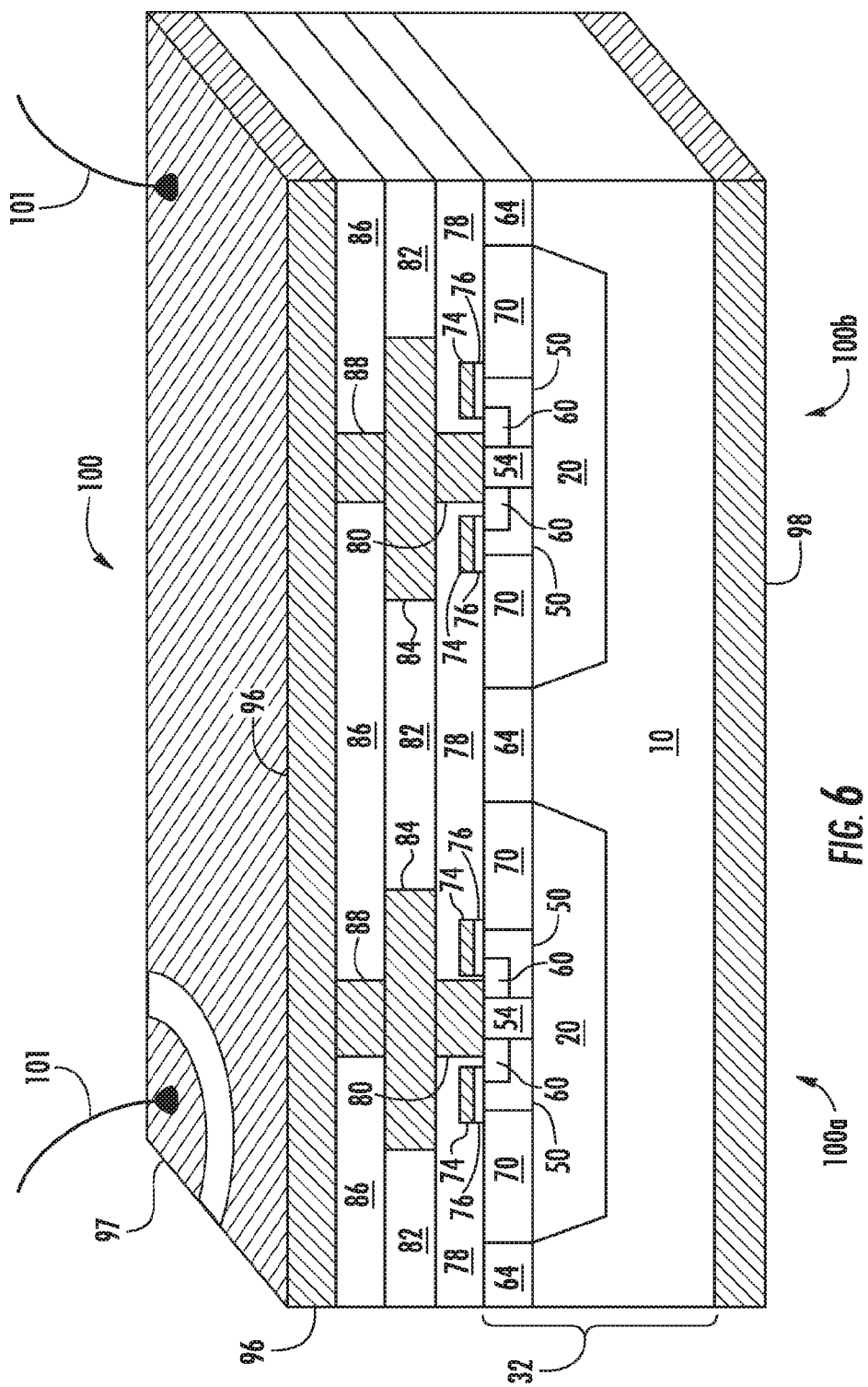
FIG. 6 illustrates a completed quasi-lateral power MOSFET including a cavity wafer.

FIG. 6 illustrates a completed quasi-lateral MOSFET 100 based on cavity wafer 32. Similar interconnection structures are used in other embodiments to form completed MOSFET devices based on other cavity wafer embodiments, e.g., cavity wafers 34, 36, or 38.

Quasi-lateral MOSFET 100 in FIG. 6 begins with cavity wafer 32 doped as illustrated in FIG. 5a. A gate structure including gate 74 and gate dielectric 76 is formed over P-channel region 50 and partially over N+ source region 60 and drift region 70. Gate 74 is conductive and, when charged, provides the electrical field necessary to create a carrier channel in P-channel region 50 that electrically connects drift region 70 and N+ source region 60. Gate 74 is formed from polysilicon in one embodiment. In some embodiments, a silicide layer is formed over the polysilicon of gate 74 to reduce resistance. Gate dielectric 76 provides electrical isolation between gate 74 and device wafer 30. In one embodiment, two gates 74 are completely within the footprint of a single cavity 20, i.e., each side of cavity 20 extends past an outside edge of a gate 74. In some embodiments, drift region 70 is doped after formation of gates 74, and gates 74 are used to self-align drift region 70.

Insulating layer 78 is applied over device wafer 30 and gates 74. Insulating layer 78 contains one or more layers of prepreg, photosensitive low curing temperature dielectric resist, photosensitive composite resist, liquid crystal polymer (LCP), laminate compound film, insulation paste with filler, solder mask resist film, liquid molding compound, granular molding compound, polyimide (PI), benzocyclobutene (BCB), polybenzoxazoles (PBO), hafnium oxide (HfO2), silicon dioxide (SiO2), silicon nitride (Si3N4), silicon oxynitride (SiON), tantalum pentoxide (Ta2O5), aluminum oxide (Al2O3), solder resist, or other material having similar insulating and structural properties. Insulating layer 78 is deposited using printing, spin coating, spray coating, lamination, or other suitable process.

A portion of insulating layer 78 is removed by etching or laser direct ablation (LDA) to form openings in insulating layer 78 and expose portions of P+ body contacts 54 and N+ source regions 60. Conductive layers 80 are formed in the openings of insulating layer 78 to electrically contact P+ body contact 54 and N+ source region 60. The openings through insulating layer 78 are filled with aluminum (Al), copper (Cu), tin (Sn), nickel (Ni), gold (Au), silver (Ag), titanium (Ti), tungsten (W), or other suitable electrically conductive material or combination thereof using PVD, CVD, electrolytic plating, electroless plating process, or other suitable metal deposition process to form conductive layer 80. In some embodiments, conductive layer 80 is formed over cavity wafer 32 prior to formation of insulating layer 78 by a suitable plating process. A planarizing process, e.g., using a grinder or a CMP process, is performed after formation of insulating layer 78 and conductive layer 80 in some embodiments.

Insulating layer 82 is formed over insulating layer 78 and conductive layer 80. Insulating layer 82 is formed of similar materials and in a similar process as insulating layer 78. A portion of insulating layer 82 is removed to expose conductive layer 80. The openings through insulating layer 82 are filled with conductive material to form conductive layer 84 in a similar manner to conductive layer 80. In embodiments where conductive layer 84 is formed prior to insulating layer 82, a patterning and metal deposition process such as PVD, CVD, sputtering, electrolytic plating, or electroless plating is used, and a portion of conductive layer 84 is removed prior to depositing insulating layer 82. Conductive layer 84 and insulating layer 82 are planarized in some embodiments. Insulating layer 86 and conductive layer 88 are similar to insulating layer 78 and conductive layer 80, respectively.

A conductive layer 96 is formed over substantially the entire width of cavity wafer 32 as a source contact. When quasi-lateral MOSFET 100 is eventually packaged, conductive layer 96 provides external contact to quasi-lateral MOSFET 100. A portion 97 of conductive layer 96 is electrically isolated and electrically coupled to gates 74 to provide an external gate contact. In one embodiment, conductive layer 96, including portion 97, is directly exposed from the package of quasi-lateral MOSFET 100 to be soldered to a PCB or other substrate. In other embodiments, an additional interconnect structure, e.g., solder bumps, stud bumps, or bond wires, is formed over conductive layer 96 as a part of the packaging process. Bond wires 101 are one embodiment of an interconnect structure formed over quasi-lateral MOSFET 100 for external interconnect.

Conductive layers 80, 84, 88, and 96 constitute an interconnect structure formed over cavity wafer 32, and provide electrical connection to the source terminal of quasi-lateral MOSFET 100. Conductive layer 98 is similar to conductive layer 96 and provides an external drain contact for quasi-lateral MOSFET 100. In some embodiments, insulating layers 82 and 86, and conductive layers 84 and 88 are not used. Conductive layer 96 is formed directly in insulating layer 78 and conductive layer 80. Other numbers of insulating and conductive layers are formed over cavity wafer 32 in other embodiments. Using conductive layers 84 and 88 to increase the distance between conductive layer 96 and handle wafer 10 reduces drain-to-source capacitance.

Quasi-lateral MOSFET 100 with cavities 20 has a reduced parasitic capacitance between the drain and source of quasi-lateral MOSFET 100. Cavities 20 increase the maximum switching frequency of quasi-lateral MOSFET 100 and reduce the amount of energy required to switch quasi-lateral MOSFET 100. In addition, cavity 20 being vacuum or gas-filled, rather than a solid insulating material, allows RESURF designs similar to a silicon-on-insulator device while reducing the effect of hot-carriers and oxide charge trapping. Reducing hot-carrier effects improves the reliability of quasi-lateral MOSFET 100 because cavity 20 does not include a solid insulating material in which charge can become trapped.

Direct wafer-to-wafer bonding is used to form cavity 20 embedded in cavity wafer 32, 34, 36, or 38. The bond between handle wafer 10 and device wafer 30 is at the bottom or top of cavities 20. In either case, epitaxial layer 12 may or may not be used to reduce doping concentration at the junction between handle wafer 10 and device wafer 30. Alignment is provided between handle wafer 10 and device wafer 30 by expanding the drain region to include any alignment tolerances, by implanting a high-contrast fiducial marker visible through device wafer 30, or by fully extending drift region 70 over the contact area of handle wafer 10 with device wafer 30. Drift region 70 is a superjunction, silicon-on-insulator (SOI) RESURF, or simple RESURF drift region in various embodiments.

Quasi-lateral MOSFET 100 includes a plurality of MOSFET cells wired in parallel. FIG. 6 illustrates two MOSFET cells, 100a and 100b, connected in parallel, each cell including a cavity 20. In other embodiments, many more than two MOSFET cells are wired in parallel to form a MOSFET device. Quasi-lateral MOSFET 100 is compatible with standard power MOSFET packaging technology designed for vertical power MOSFETs, with metal drain contact 98 on the bottom of the package, and metal source contact 96 and metal gate contact 97 on top of the package. In some embodiments, the interconnect structure over cavity wafer 32 includes metal layers providing connection from the drain of quasi-lateral MOSFET 100, at N+ drain region 64, to the top surface of the device.

The subsequent figures illustrate cavities used in various other MOSFET embodiments. In addition to MOSFETs, similar cavity structures could potentially have advantages when used in other types of semiconductor devices, e.g., diodes or bipolar junction transistors.

Figure 7A:
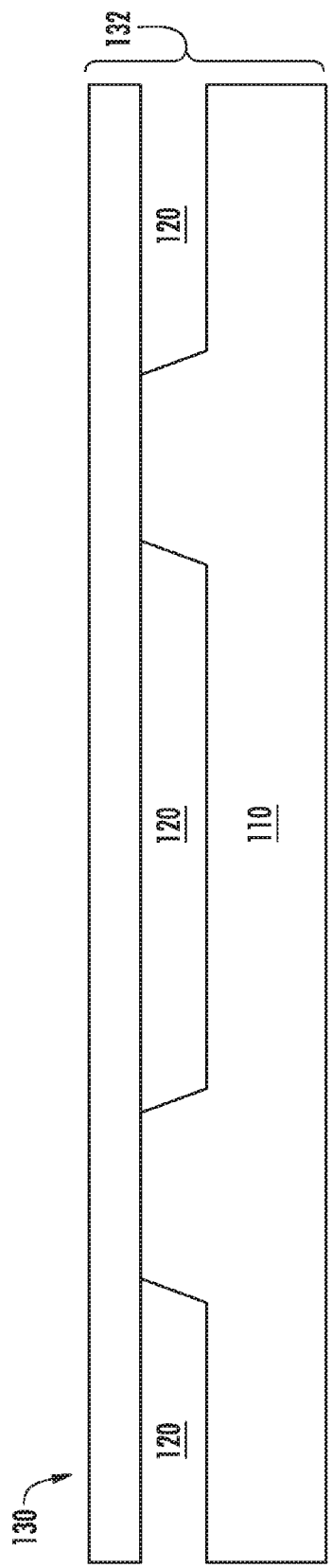
FIGS. 7a-7c illustrate forming a lateral MOSFET with a cavity wafer.
Figure 7B:
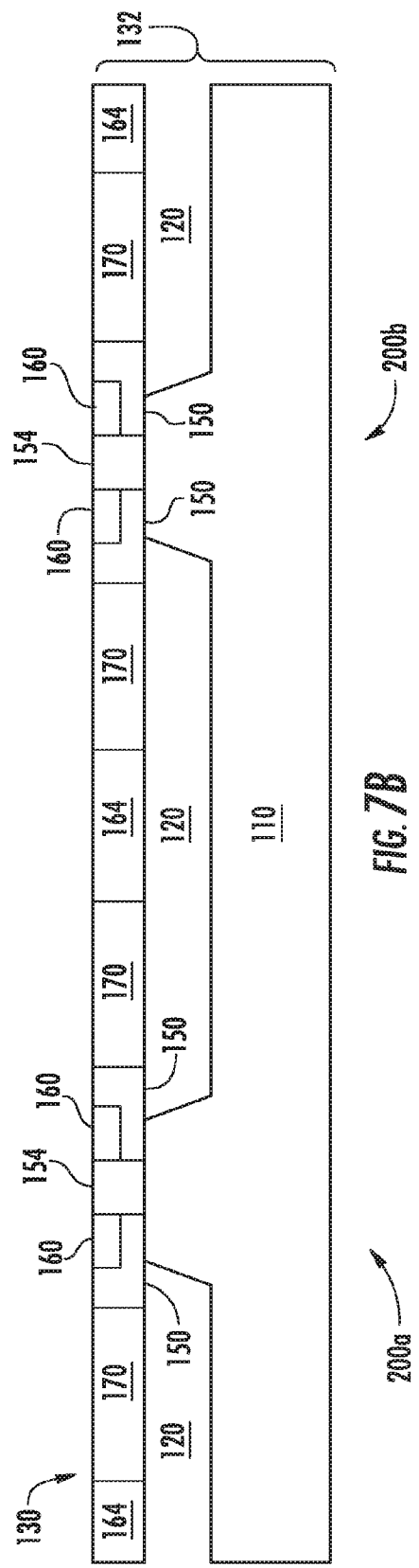
Figure 7C:
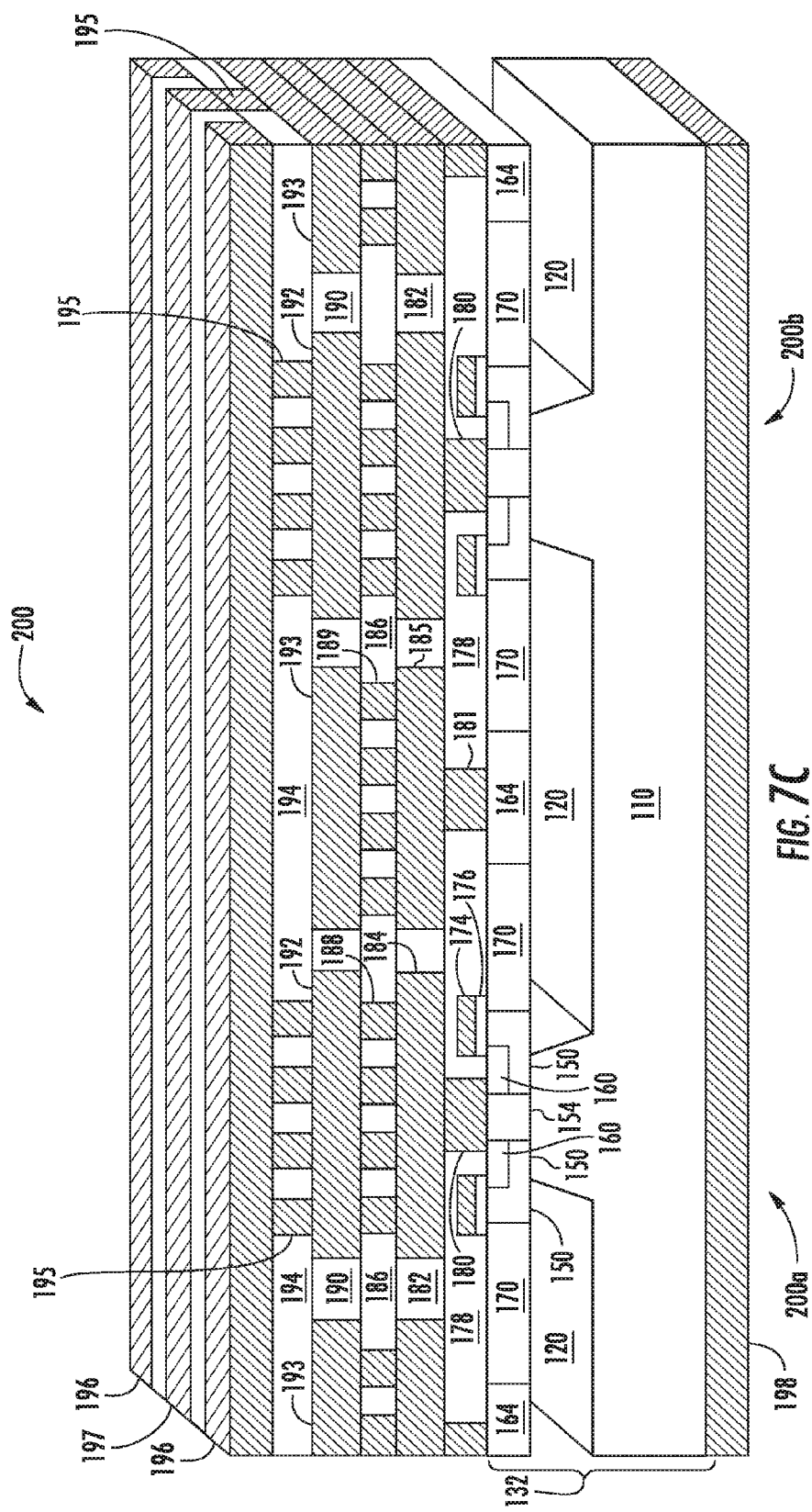

FIGS. 7a-7c illustrate formation of a lateral cavity MOSFET 200. Lateral cavity MOSFET 200 is based on handle wafer 110 with cavities 120. Device wafer 130 is bonded to handle wafer 110 over cavities 120 to form cavity wafer 132, illustrated in FIG. 7a. Handle wafer 110 is similar to handle wafer 10 of quasi-lateral MOSFET 100. However, handle wafer 110 includes a P+ doping, which is an opposite doping of handle wafer 10 in FIG. 6. Handle wafer 110 is coupled to a source region subsequently formed in device wafer 130, whereas handle wafer 10 is coupled to a drain region in device wafer 30. Device wafer 130 is similar to device wafer 30. Similar to cavities 20, cavities 120 are formed in either handle wafer 110 or device wafer 130 in different embodiments. In other embodiments, cavities 120 are formed in a relatively lightly doped epitaxial layer grown on either handle wafer 110 or device wafer 130. Handle wafer 110 is bonded to device wafer 130 by direct wafer-to-wafer bonding. Cavity 120 is formed to approximately the same size as cavity 20, and can be either a stripe stretching substantially completely across handle wafer 10 or device wafer 30, or formed as a series of line segments.

In FIG. 7b, device wafer 130 is doped with the regions necessary to form MOSFET cells 200a and 200b. P-channel region 150 is similar to P-channel region 50. P+ body contact 154 is similar to P+ body contact 54. N+ source region 160 is similar to N+ source region 60. N+ drain region 164 is similar to N+ drain region 64. Drift region 170 is similar to drift region 70. The doping regions of device wafer 130 are similar to the doping regions of device wafer 30, except that the doping regions of device wafer 130 have N+ drain regions 164 centered over cavities 120, while P+ body contacts 54 of device wafer 30 are centered over cavities 20. Handle wafer 110 contacts P+ body contact 154, whereas handle wafer 10 contacts N+ drain region 64. Drift region 170 is a superjunction, SOI RESURF, or simple RESURF drift region in various embodiments, similar to drift region 70. A plurality of masks are used as necessary to deposit the proper dopant concentrations into the various doped regions of device wafer 130.

Cavity wafer 132 is aligned using similar methods as cavity wafers 32, 34, 36, and 38. In one embodiment, P-channel regions 150 and P+ body contact 154 are sized so that the contact area between handle wafer 110 and device wafer 130 falls completely within the footprint of P-channel regions 150 and P+ body contact 154 at the maximum expected misalignment. In another embodiment, a fiducial marker is disposed in handle wafer 110 and visible through device wafer 130.

In FIG. 7c, gate structures, including gates 174 and gate dielectric 176, are formed over P-channel regions 150. In one embodiment, drift region 170 is doped after, and self-aligned to, gates 174. An interconnect structure for external interconnect is formed over cavity wafer 132. Conductive layer 180 is formed on N+ source regions 160 and P+ body contacts 154 to create metal source contacts. Conductive layer 181 is formed on N+ drain regions 164 to create metal drain contacts. In one embodiment, conductive layer 180 and conductive layer 181 are formed in openings of insulating layer 178, similar to the formation of conductive layer 80 in FIG. 6. Insulating layers 182, 186, 190, and 194 are similar to insulating layers 82 and 86. Conductive layers 184, 185, 188, 189, 192, 193, and 195 are similar to conductive layers 84 and 88. Conductive layer 196 is formed as a stripe oriented left to right in FIG. 7c. Conductive layer 196 provides external connection to P+ body contact 154 and N+ source region 160. Lateral cavity MOSFET 200 includes conductive layer 196 formed as a plurality of stripes, each connected to P+ body contact 154 and N+ source region 160. The stripes of conductive layer 196 are interleaved with stripes 197, which are coupled to N+ drain region 164 through portions of conductive layer 195.

In some embodiments, the portion of handle wafer 110 around cavities 120 and contacting device wafer 130 is designed to provide an effect similar to field plates. Handle wafer 110 near P-channel 150 shields gate 174 from the source electric field of lateral cavity MOSFET 200. A higher dopant concentration is possible in drift region 170 by reducing the electric field experienced at gate 174, which reduces on-state resistance of lateral cavity MOSFET 200. In addition, an electric field from handle wafer 110 across cavity 120 helps deplete drift region 170, allowing further increase in doping of drift region 170.

Conductive layers 180, 184, 188, 192, 195, and 196 provide interconnection from P+ body contact 154 and N+ source region 160 of lateral cavity MOSFET 200 to an external PCB or other substrate. Conductive layers 181, 185, 189, 193, 195, and 197 provide external interconnection to N+ drain region 164 of lateral cavity MOSFET 200. Conductive layer 197 is formed as stripes interleaved with stripes of conductive layer 196, and provides interconnection from conductive layer 193 to the top surface of lateral cavity MOSFET 200 via portions of conductive layer 195. In other embodiments, any number of conductive and insulating layers are formed over cavity wafer 132 to provide external interconnect. An optional conductive layer 198 is formed on the surface of handle wafer 110 opposite cavities 120 as a source contact in some embodiments.

Lateral cavity MOSFET 200 includes cavities 120 to reduce capacitance from drain to source. Lateral cavity MOSFET 200 is compatible with power MOSFET packaging technology designed for lateral power MOSFETs, including land grid array, ball grid array, and copper pillar packaging. Source, drain, and gate contacts are all located on a top surface of lateral cavity MOSFET 200. FIG. 7c illustrates two MOSFET cells, 200a and 200b, connected in parallel, but any number of MOSFET cells are wired in parallel in other embodiments. Each MOSFET cell extends perpendicular to the page of FIG. 7c, and has a length that is customized to the requirements of specific embodiments.

FIGS. 8a-8d illustrate formation of a vertical trench MOSFET cell 300. In FIG. 8a, a handle wafer 210 is provided. Cavities 220 are formed in handle wafer 210. Cavities 220 are similar to cavities 20 and 120, but oriented vertically rather than horizontally. A plurality of parallel cavities 220 are formed, with each cavity comprising a vertical trench extending perpendicular to the page of FIG. 8a. Each vertical trench MOSFET cell 300 formed on handle wafer 210 includes a single cavity 220. Doped regions 222 and 224 are formed in handle wafer 210 adjacent to cavity 220 using an angled implantation, and form a charge balanced superjunction drift region. In one embodiment, a simple lightly-doped drift (LDD) region is used instead of a charge-balanced superjunction. In some embodiments, doped regions 222 and 224 are formed into a superjunction by successively growing and then doping one or more epitaxial layers on handle wafer 210.

The width of cavity 220 is between one and two μm in one embodiment. The depth of cavity 220 is dependent on the mechanical constraints of regions 222 and 224 being able to support the structure of vertical trench MOSFET 300. Cavities 220 may be formed as long stripes across an entire handle wafer 210, or broken into an array of line segments.

In FIG. 8b, device wafer 230 is disposed over handle wafer 210 and cavity 220. Device wafer 230 is bonded to handle wafer 210 using direct wafer-to-wafer bonding to enclose cavity 220. In some embodiments, cavity 220 is formed in or over device wafer 230, and doped regions 222 and 224 are formed in device wafer 30. Then device wafer 230, including cavities 220 and doped regions 222 and 224, is disposed over and bonded to handle wafer 210.

FIG. 8c illustrates the functional regions of a MOSFET formed in device wafer 230. Region 232 forms a part of the drift region along with doped regions 222 and 224. P-channel regions 250 block current through vertical trench MOSFET 300 until a sufficient charge on gate 274 creates a channel of majority carriers through P-channel regions 250. N+ source region 260 and P+ body contact 254 operate similarly to N+ source region 60 and P+ body contact 54, respectively, and provide good ohmic contact with a subsequently formed conductive layer. Gate 274 is formed by depositing conductive material in a trench over cavity 220 and extending perpendicular with the page of FIG. 8c. Gate dielectric 276 electrically isolates gate 274 from device wafer 230.

The doped regions of vertical trench MOSFET 300 are aligned using similar methods as cavity wafers 32, 34, 36, and 38. In one embodiment, cavity 220 is large enough that gate 274 falls completely within the footprint of cavity 220 at the maximum expected misalignment. In another embodiment, a fiducial marker is disposed in handle wafer 210 or doped regions 222 and 224, and visible through device wafer 230 for alignment.

In FIG. 8d, metal layers 288 and 296 are formed over device wafer 230 to provide external interconnection to P+ body contact 254 and N+ source region 260. Dielectric layer 286 provides additional separation between metal layer 296 and gate 274, reducing gate to source capacitance. Conductive layer 298 is formed over handle wafer 210 as an external drain contact.

Vertical trench MOSFET 300 is a vertical MOSFET. The vertical drift region formed by doped regions 222, 224, and 232 provides lower area-specific on-resistance but higher area-specific capacitance than the lateral designs of quasi-lateral cavity MOSFET 100 and lateral cavity MOSFET 200. Cavity 220 helps reduce the parasitic capacitance of vertical trench MOSFET 300. Vertical trench MOSFET 300 is singulated to include any number of adjacent cavities 220, and any necessary length of cavities 220, as required to create a final packaged device with desired characteristics. FIG. 8d illustrates a single MOSFET cell, but each adjacent cavity 220 includes a similar MOSFET cell around cavity 220 coupled in parallel.

FIGS. 9a-9d illustrate formation of a vertical planar-gate MOSFET 400. Handle wafer 310 includes relatively lightly N-doped regions 312 and P-doped region 314 formed on handle wafer 10 as a drift region. Regions 312 and 314 form a charge-balanced superjunction, and are formed by successively forming and then doping the regions in one or more epitaxial layers.

Figure 9A:
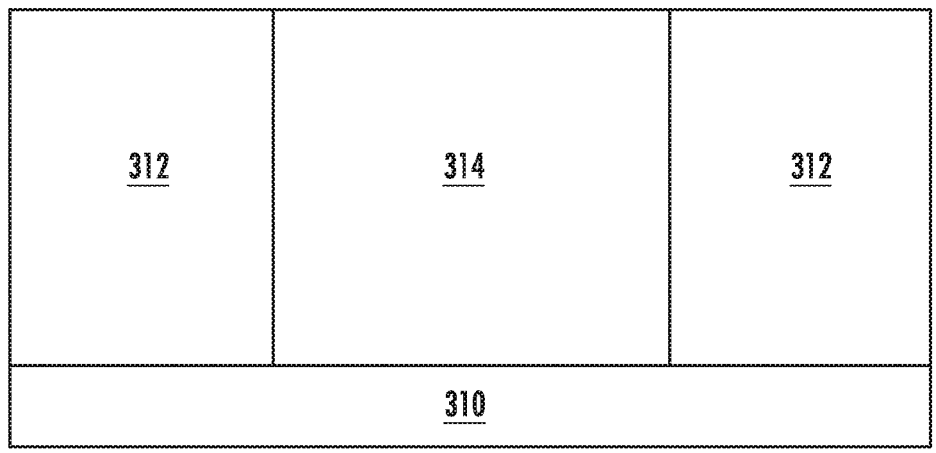
FIGS. 9a-9d illustrate forming a vertical planar-gate MOSFET with a cavity wafer.
Figure 9B:
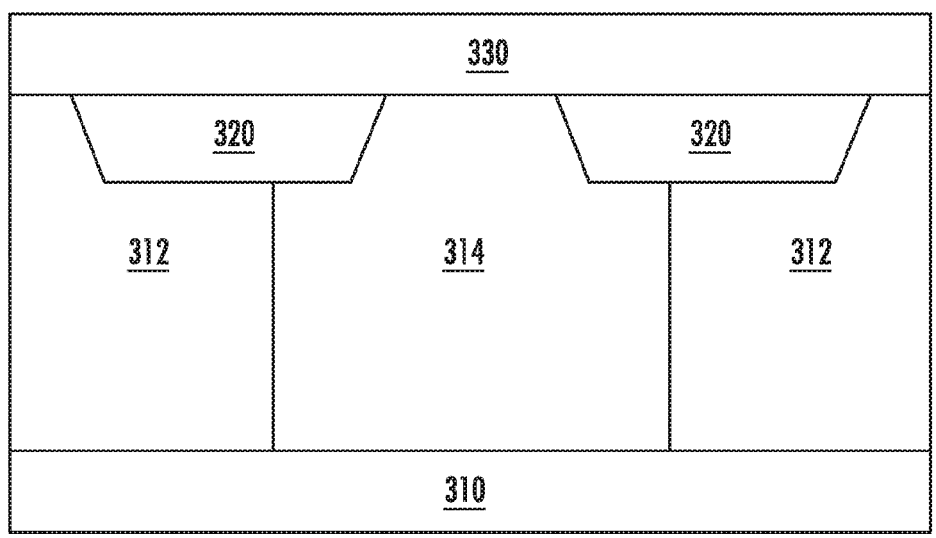

In FIG. 9b, cavities 320 are formed in doped regions 312 and 314. Cavities 320 are formed similarly to cavity 20. Device wafer 330 is disposed over and bonded to regions 312 and 314 using direct wafer-to-wafer bonding. In one embodiment, cavities 320 are between four and twelve μm wide and between one and ten μm deep. Cavities 320 can be stripes extending perpendicularly across substantially an entire handle wafer 310 or broken into an array of line segments.

Figure 9C:
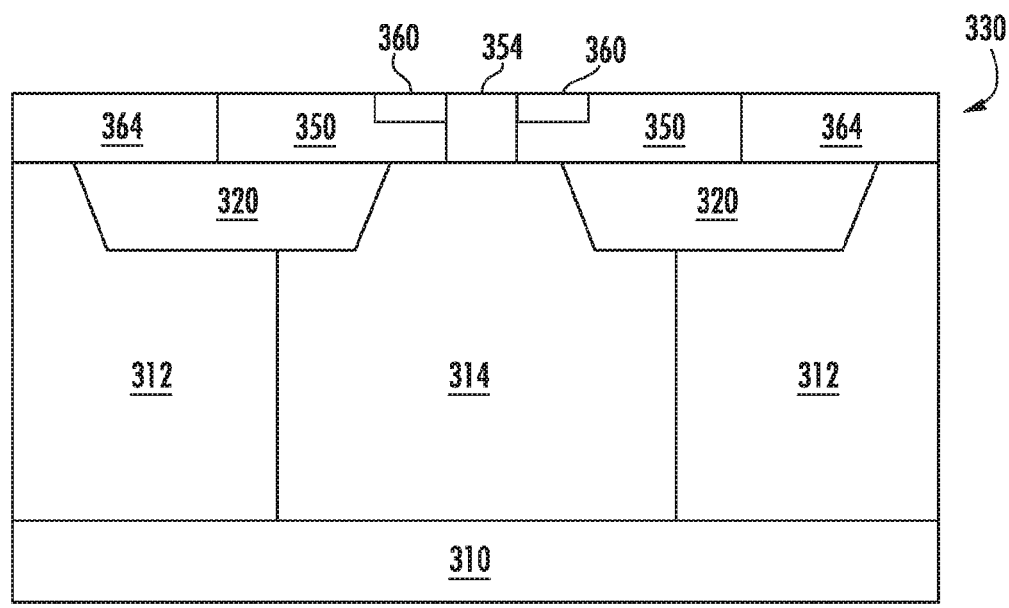

In FIG. 9c, the operable regions of vertical planar-gate MOSFET 400 are doped into device wafer 330. P+ body contact 354 and N+ source region 360 are formed and operate similarly to P+ body contact 54 and N+ source region 60, respectively. P-channel region 350 is similar to P-channel region 50. N+ drain regions 364 are similar to N+ drain regions 64.

Figure 9D:
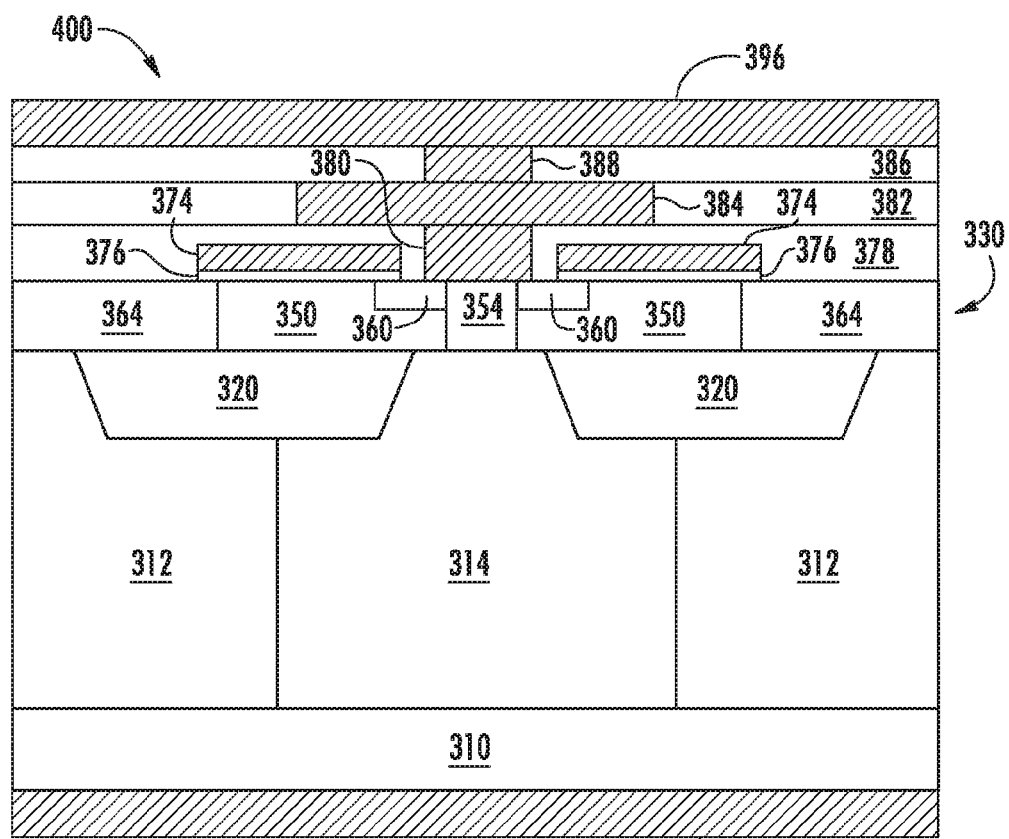

FIG. 9d illustrates gate 374 and gate dielectric 376 formed over P-channel region 350. Gate 374 is similar to gate 74. Insulating layer 378 is formed over gates 374, and conductive layer 380 is formed in an opening of insulating layer 378. In one embodiment, each gate 374 is located completely within a footprint of a corresponding cavity 320. Insulating layer 382 and conductive layer 384 are formed over insulating layer 378. Insulating layer 386 and conductive layer 388 are formed over insulating layer 382 and conductive layer 384. Conductive layer 396 is formed over substantially the entire top surface of conductive layer 388 and insulating layer 386 as a source contact. A portion of conductive layer 396 is electrically isolated from the remainder of conductive layer 396 and utilized as a contact to gates 374. The remainder of conductive layer 396 is coupled to P+ body contact 354 and N+ source region 360 via conductive layers 380, 384, and 388. Conductive layer 398 is formed over substantially the entire bottom surface of handle wafer 310 as a drain contact. Vertical planar-gate MOSFET 400 is singulated and packaged after formation of conductive layers 396 and 398. One MOSFET cell is illustrated in FIG. 9d, but any number of MOSFET cells are formed on handle wafer 310 and coupled in parallel.

Doping of device wafer 330 is aligned to cavities 320 using similar methods as cavity wafers 32-38. Gates 374 are sized and positioned such that gates 374 are over cavities 320 even under the highest expected misalignment. In another embodiment, a fiducial marker is disposed in regions 312 or 314 and visible through device wafer 330.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a first semiconductor wafer;
   forming a cavity in the first semiconductor wafer;
   bonding a second semiconductor wafer to the first semiconductor wafer over the cavity; and
   forming a transistor including a first portion of the transistor disposed over the cavity and a second portion of the transistor disposed outside a footprint of the cavity,
   wherein forming the cavity includes forming sidewalls of the cavity, the sidewalls defining outermost boundaries of the footprint, and wherein forming the transistor including the second portion includes forming the second portion outside the outermost boundaries of the footprint.

2. The method of claim 1, wherein forming the transistor further includes:
   forming a P-channel region over the cavity;
   forming a drain region outside the footprint of the cavity; and
   forming a drift region between the P-channel region and drain region.

3. The method of claim 1, further including forming a superjunction over the cavity in the first semiconductor wafer or second semiconductor wafer.

4. The method of claim 3, further including forming a channel region adjacent to the superjunction.

5. The method of claim 1, further including forming a fiducial marker in the first semiconductor wafer.

6. The method of claim 1, further including forming an epitaxial layer on the first semiconductor wafer prior to forming the cavity.

7. A method of making a semiconductor device, comprising:
   providing a first semiconductor die;
   forming a cavity in the first semiconductor die;
   bonding a second semiconductor die to the first semiconductor die over the cavity; and
   forming a transistor including a gate of a transistor formed over the cavity and another portion of the transistor disposed outside a footprint of the cavity,
   wherein forming the cavity includes forming sidewalls of the cavity, the sidewalls defining outermost boundaries of the footprint, and wherein forming the transistor including the another portion includes forming the another portion outside the outermost boundaries of the footprint.

8. The method of claim 7, further including forming the gate in a trench.

9. The method of claim 7, further including forming a drift region entirely within the footprint of the cavity.

10. The method of claim 7, further including forming the gate over the first semiconductor die.

11. The method of claim 7, further including forming the gate over the second semiconductor die.

12. The method of claim 7, further including forming an interconnect structure over the gate.

13. A semiconductor device, comprising:
a first semiconductor die including a cavity formed in the first semiconductor die;
a second semiconductor die bonded to the first semiconductor die over the cavity; and
a first transistor including a portion of the first transistor formed over the cavity and a second portion of the transistor disposed outside a footprint of the cavity,
wherein the cavity includes sidewalls defining outermost boundaries of the footprint, and wherein the second portion of the transistor is disposed outside the outermost boundaries of the footprint.

14. The semiconductor device of claim 13, further including an epitaxial layer disposed around the cavity.

15. The semiconductor device of claim 13, further including a fiducial marker disposed between the first semiconductor die and second semiconductor die.

16. The semiconductor device of claim 13, further including a superjunction formed in the first semiconductor die or second semiconductor die.

17. The semiconductor device of claim 13, further including a reduced surface field (RESURF) drift region formed in the first semiconductor die or second semiconductor die.

18. The semiconductor device of claim 13, further including a second transistor including a portion of the second transistor formed over the cavity.

19. The semiconductor device of claim 13, further including:
a first conductive layer disposed over the first semiconductor die; and
a second conductive layer disposed over the second semiconductor die.

* * * * *